US010818592B1

(12) United States Patent
Lin

(10) Patent No.: US 10,818,592 B1
(45) Date of Patent: *Oct. 27, 2020

(54) SEMICONDUCTOR MEMORY DEVICE INCLUDING DECOUPLING CAPACITOR ARRAY ARRANGED OVERLYING ONE-TIME PROGRAMMABLE DEVICE

(71) Applicant: NANYA TECHNOLOGY CORPORATION, New Taipei (TW)

(72) Inventor: Shian-Jyh Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,306

(22) Filed: Jul. 19, 2019

Related U.S. Application Data

(63) Continuation-in-part of application No. 16/397,412, filed on Apr. 29, 2019.

(51) Int. Cl.
*H01L 23/525* (2006.01)
*H01L 27/108* (2006.01)

(52) U.S. Cl.
CPC .... *H01L 23/5252* (2013.01); *H01L 27/10808* (2013.01); *H01L 27/10897* (2013.01)

(58) Field of Classification Search
CPC ......... H01L 27/10808; H01L 27/10897; H01L 27/11206; H01L 27/11286; H01L 2924/145; H01L 2924/1451; H01L 2924/14511; H01L 2924/1453; H01L 23/5252

See application file for complete search history.

(56) References Cited

U.S. PATENT DOCUMENTS

| 9,666,262 | B2* | 5/2017 | Kim | ........................ G11C 5/14 |
| 2003/0116799 | A1* | 6/2003 | Taniguchi | ......... H01L 27/10894 257/303 |
| 2010/0065944 | A1* | 3/2010 | Tu | ..................... H01L 27/10852 257/532 |
| 2019/0393231 | A1* | 12/2019 | Sreeramaneni | ..... H01L 23/5256 |

FOREIGN PATENT DOCUMENTS

| TW | 503959 B | 10/2015 |
| TW | 525750 B | 3/2016 |

OTHER PUBLICATIONS

Office Action dated Jun. 19, 2020 in TW Application No. 108126679.
Office Action dated Jun. 5, 2020 in U.S. Appl. No. 16/397,412.

* cited by examiner

*Primary Examiner* — Matthew E. Gordon
(74) *Attorney, Agent, or Firm* — Muncy, Geissler, Olds & Lowe, P.C.

(57) ABSTRACT

A semiconductor structure is provided. The semiconductor structure includes a substrate, a plurality of one-time-programmable (OTP) cells, a bottom cell plate, a top cell plate and a decoupling capacitor array. The substrate includes a plurality of active areas and at least one isolation structure provided between the active areas to isolate the active areas from one another. The plurality of OTP cells are disposed in the active areas, the bottom cell plate is disposed on the OTP cells, and the top cell plate is disposed over the bottom cell plate. The decoupling capacitor array is disposed between the bottom cell plate and the top cell plate, and overlies the OTP cells.

17 Claims, 15 Drawing Sheets

SEMICONDUCTOR MEMORY DEVICE INCLUDING DECOUPLING CAPACITOR ARRAY ARRANGED OVERLYING ONE-TIME PROGRAMMABLE DEVICE

PRIORITY CLAIM AND CROSS-REFERENCE

This is a continuation-in-part application of U.S. patent application Ser. No. 16/397,412, filed Apr. 29, 2019, the entirety content of which is hereby incorporated by reference herein.

TECHNICAL FIELD

The present disclosure relates to a semiconductor structure, a semiconductor chip and a method of manufacturing the semiconductor structure, and more particularly, to a semiconductor structure including a stacked one-time-programmable (OTP) device and decoupling capacitor array, a semiconductor chip including the semiconductor structure, and a method of manufacturing the semiconductor structure.

DISCUSSION OF THE BACKGROUND

Integrated circuit technology has experienced continuous rapid advancement due to constant improvements in the integration density of various electronic components. The integrated components of a semiconductor occupy volume near the surface of the semiconductor wafer. Although dramatic improvements in lithography have resulted in considerable improvements in two-dimensional (2D) integrated circuit formation, there are physical limitations to the density that can be achieved in two dimensions.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate, a plurality of one-time-programmable (OTP) cells, a bottom cell plate, a top cell plate and a decoupling capacitor array. The substrate includes a plurality of active areas and an isolation structure provided between the active areas to isolate the active areas from one another. The plurality of OTP cells are disposed in the active areas. The bottom cell plate is disposed on the OTP cells and the top cell plate is disposed over the bottom cell plate. The decoupling capacitor array is disposed between the bottom cell plate and the top cell plate.

In some embodiments, the decoupling capacitor array includes a first conductive layer, an insulating layer and a second conductive layer; the first conductive layer is disposed on portions of the bottom cell plate, the insulating layer is disposed on the first conductive layer and the second conductive layer is disposed on the insulating layer.

In some embodiments, the first conductive layer comprises a plurality of U-shaped structures.

In some embodiments, the semiconductor structure further includes a conductive filler and an insulating filler between the second conductive layer and the top cell plate, wherein the conductive filler is surrounded by the U-shaped structures, and the insulating filler is disposed between two adjacent U-shaped structures.

In some embodiments, the insulating layer further covers the bottom cell plate exposed through the first conductive layer.

In some embodiments, the OTP device is an antifuse-based device that changes state from non-conducting to conducting in order to represent binary states.

In some embodiments, the semiconductor structure further includes an inter-layer dielectric sandwiched between the OTP cells and the decoupling capacitor array to electrically isolate the OTP cells from the decoupling capacitor array, wherein the bottom cell plate is disposed on the inter-layer dielectric.

In some embodiments, at least one of the plurality of OTP cells includes a first diffusion region, a control bit line, a plurality of second diffusion regions, a plurality of buried word lines, a plurality of cell dielectrics, and a plurality of cell bit lines, wherein the first diffusion region is in the substrate, the control bit line is disposed on the first diffusion region; the plurality of second diffusion regions are in the substrate and at opposite sides of the first diffusion region; the plurality of buried word lines are in the substrate and between the first diffusion region and the second diffusion regions; the plurality of cell dielectrics are disposed on the second diffusion regions; and the plurality of cell bit lines are disposed on the cell dielectrics.

In some embodiments, at least one of the plurality of buried word lines includes a conductor disposed in the substrate and an insulating liner disposed between the substrate and the conductor.

In some embodiments, the active areas extend along a first direction, the buried word lines extend along a second direction and intersect with the active areas at an angle of less than 90 degrees, and the control bit line and the cell bit lines extend along a third direction substantially perpendicular to the second direction.

In some embodiments, the angle is in a range between 15 and 60 degrees.

Another aspect of the present disclosure provides a semiconductor chip. The semiconductor chip includes a first region including a main device and a second region including a one-time-programmable (OTP) device, a bottom cell plate over the OTP device, a top cell plate over the bottom cell plate, and a decoupling capacitor array between the bottom cell plate and the top cell plate.

In some embodiments, the semiconductor chip further includes a substrate extending to comprise a portion of the main device and a portion of the OTP device.

In some embodiments, the OTP device includes a plurality of OTP cells, and at least one of the plurality of OTP cells is disposed in an active area of the substrate and includes a first diffusion region, a control bit line, a plurality of second diffusion regions, a plurality of buried word lines, a plurality of cell dielectrics, and a plurality of cell bit lines, wherein the first diffusion region is in the substrate, the control bit line is disposed on the first diffusion region, the plurality of second diffusion regions are in the substrate and at opposite sides of the first region, the plurality of buried word lines are in the substrate and between the first diffusion region and the second diffusion regions, the plurality of cell dielectrics are disposed on the second diffusion regions, and the plurality of cell bit lines are disposed on the cell dielectrics.

In some embodiments, the decoupling capacitor array includes a first conductive layer, a second conductive layer and an insulating layer; the first conductive layer is on the bottom cell plate, wherein the first conductive layer comprises a plurality of U-shaped structures, the second conductive layer is disposed over the first conductive layer, and the insulating layer is disposed between the first conductive layer and the second conductive layer.

In some embodiments, the main device includes a plurality of access transistors and a plurality of storage capacitors disposed over the access transistors and electrically coupled to the access transistors.

In some embodiments, the main device further comprises an isolation layer disposed between the access transistor and the storage capacitor, and a plug disposed in the isolation layer and connecting the access transistor to the storage capacitor. The inter-layer dielectric is formed in a manner similar to that of the isolation layer, and the first conductive layer is formed in a manner similar to that of the plug. The decoupling capacitor array is electrically isolated from the OTP device.

Another aspect of the present disclosure provides a method of manufacturing a semiconductor structure. The method includes steps of providing a substrate formed with a plurality of line-shaped active areas and an isolation structure between the line-shaped active areas to isolate the line-shaped active areas; forming a plurality of buried word lines in the line-shaped active area; implanting ions in the line-shaped active areas to form a first diffusion region and a plurality of second diffusion regions on either side of the buried word lines; depositing cell dielectrics on the second diffusion regions; depositing a control bit line on the first diffusion region; depositing a plurality of cell bit lines on the cell dielectric; depositing an inter-layer dielectric on the buried word lines, the control bit line and the cell bit lines; forming a bottom cell plate on the inter-layer dielectric; depositing a first conductive layer on portions of the bottom cell plate; depositing an insulating layer on the first conductive layer; depositing a second conductive layer on the insulating layer; and depositing a top cell plate on the second conductive layer.

In some embodiments, the method further comprises steps of depositing a conductive filler over the first conductive layer after the deposition of the second conductive layer; and depositing an insulating filler over the bottom cell plate not covered by the first conductive layer before the deposition of the top cell plate.

In some embodiments, the method further comprises patterning the first insulating layer to from a plurality of U-shaped structures.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
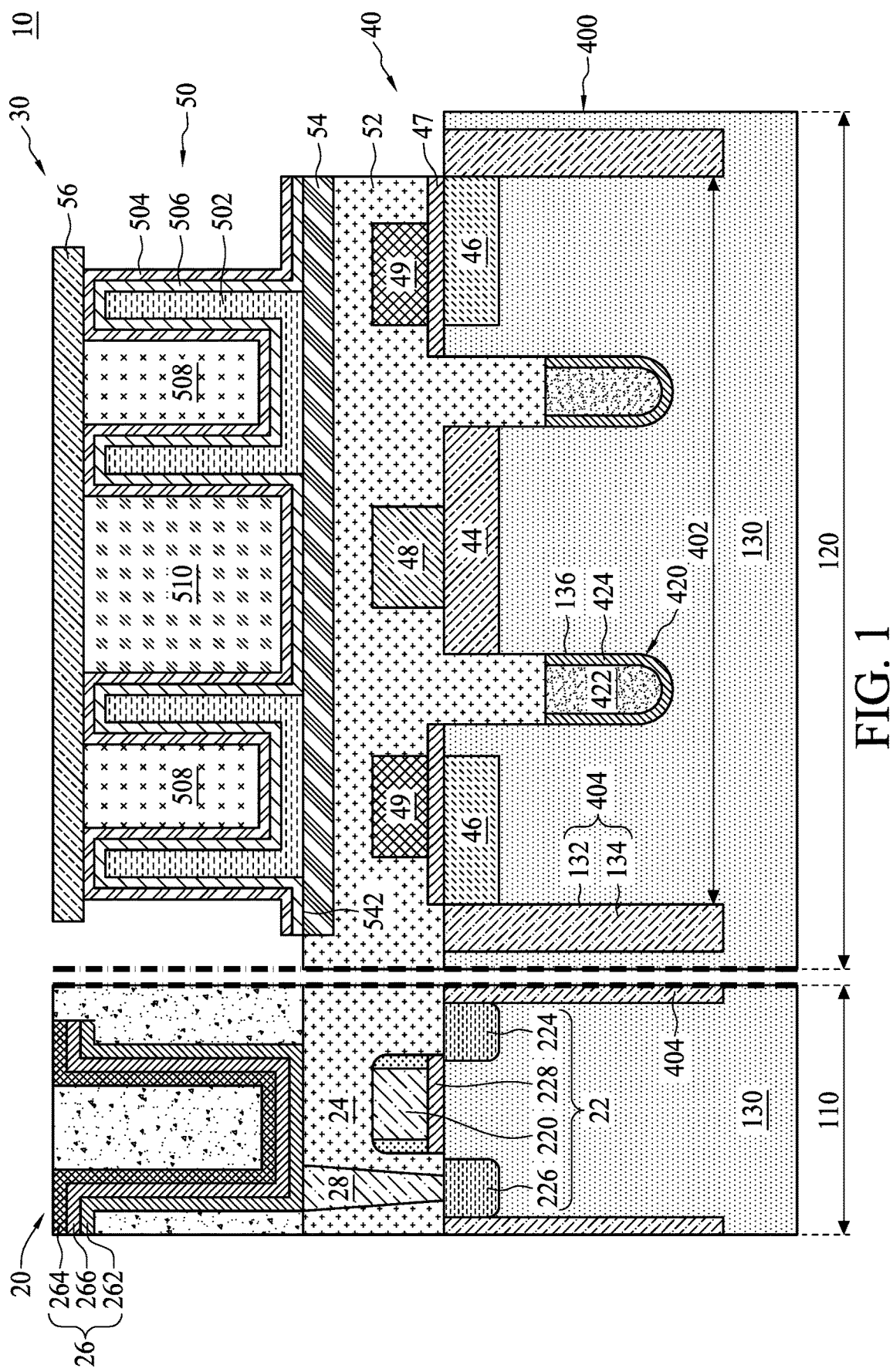
FIG. 1 is a cross-sectional view of a semiconductor chip in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor chip 10 in accordance with some embodiments of the present disclosure. Referring to FIG. 1, the semiconductor chip 10, which may have system-on-chip (SoC) applications built therein, includes a first region 110 and a second region 120. In some embodiments, the first region 110 includes one or more main devices 20; in the second region 120, a semiconductor structure 30 is formed, wherein the semiconductor structure 30 includes a one-time-programmable (OTP) device 40, used for a repair in the main device 20, and a decoupling capacitor array 50 that vertically overlaps the OTP device 40. The decoupling capacitor array 50 typically has a capacitance sufficient to supply an electrical current to on-chip circuits.

In some embodiments, the main device 20 may be a volatile memory device or a nonvolatile memory device, such as a dynamic random access memory (DRAM), an electrically erasable programmable read-only memory (EEPROM) or a flash memory. In some embodiments, the first region 110 may further include analog circuits, radio frequency (RF) circuits, logic operation circuits, or a combined circuit including more than one of these circuits. In some embodiments, the OTP device 40 may be also used for trimming an internal operation voltage or a frequency in the main device 20 where the analog circuits and the logic operation circuits exist together.

In some embodiments, the semiconductor chip 10 further includes a substrate 130 extending through the first region 110 and the second region 120. In some embodiments, the substrate 130 may be a silicon substrate or a substrate including other semiconductor materials, such as germanium, silicon germanium or other known semiconductor materials. In some embodiments, the substrate 130 extends to comprise a portion of the main device 20 and the OTP device 40.

If the main device 20 includes one or more DRAMs, the substrate 130 in the first region 110 is formed with a plurality of access transistors 22 (for simplicity, only one access transistor 22 is shown in FIG. 1), such as metal-oxide-semiconductor field effect transistors (MOSFETs), having gate structures 220, drain regions 224 and source regions 226 thereon. In some embodiments, the gate structures 220 may include polysilicon and may be formed by a chemical vapor deposition (CVD) process. In some embodiments, gate dielectrics 228 may be sandwiched between the substrate 130 and the gate structures 220. In some embodiments, the gate dielectrics 228 include oxide, nitride or oxynitride, but are not limited thereto. In some embodiments, the gate dielectrics 228 may be formed by a thermal oxidation process or a CVD process. In some embodiments, the gate dielectric 228 may have a thickness in a range of 30 to 250 angstroms.

In some embodiments, an isolation layer 24 is disposed to cover the substrate 130 and the gate structures 220. The isolation layer 24 is preferably formed of silicon oxide. In some embodiments, the isolation layer 24 is typically deposited with a low-pressure CVD process or a plasma-enhanced CVD process. After the isolation layer 24 is deposited, a planarization process using any suitable method, such as an etch-back process or a chemical mechanical polishing (CMP) process, is optionally performed on the isolation layer 24 for providing better topography.

The main device 20 further includes a plurality of storage capacitors 26 disposed over the access transistors 22. Either the drain region 224 or the source region 226 of the access transistor 22 is connected to one terminal of one of the storage capacitors 26 through a plug 28 penetrating through the isolation layer 24. In some embodiments, the plug 28 may be formed of doped polysilicon or metal such as tungsten. In some embodiments, the storage capacitor 26 includes a bottom electrode 262 formed on the isolation layer 24 and electrically coupled to the plug 28, a top electrode 264 disposed over the bottom electrode 262, and a capacitor insulator 266 disposed between the bottom electrode 262 and the top electrode 264. In some embodiments, the bottom electrode 262, the top electrode 264 and the capacitor insulator 266 may be substantially conformal layers. In some embodiments, the bottom electrode 262 and the top electrode 264 are formed of doped polysilicon, aluminum, copper or tungsten. In some embodiments, the capacitor insulator 266 may include silicon dioxide ($SiO_2$), silicon nitride ($Si_3N_4$), or high-k materials such as zirconium oxide ($Zr_2O_2$), hafnium oxide ($HfO_2$), titanium oxide ($TiO_2$), or aluminum oxide ($Al_2O_2$). In some embodiments, the capacitor insulator 266 may be formed of either a double film of nitride/oxide film or a triple film of oxide/nitride/oxide.

In some embodiments, the OTP device 40 is programmed to store a binary data value. In some embodiments, the OTP device 40 may be an antifuse-based device or a fuse-based device. In some embodiments, the antifuse-based device and the fuse-based device are alterable to a conductive state; equivalently, the binary states can be one of either high resistance or low resistance in response to electric stress, such as a programming voltage or current. In detail, the antifuse-based device is an electronic device that changes state from non-conducting to conducting. In contrast, the fuse-based device is an electronic device that changes state from conducting to non-conducting. In other words, the resistance of the antifuse-based device in an un-programmed state is greater than that in a programmed state, while the converse is true for the fuse-based device. With respect to power consumption, the antifuse-based device uses less power in the un-programmed state as compared to the fuse-based device. In alternative embodiments, the OTP device 40 may be blown using an electrical programming mechanism or other programming mechanism.

Figure 2:
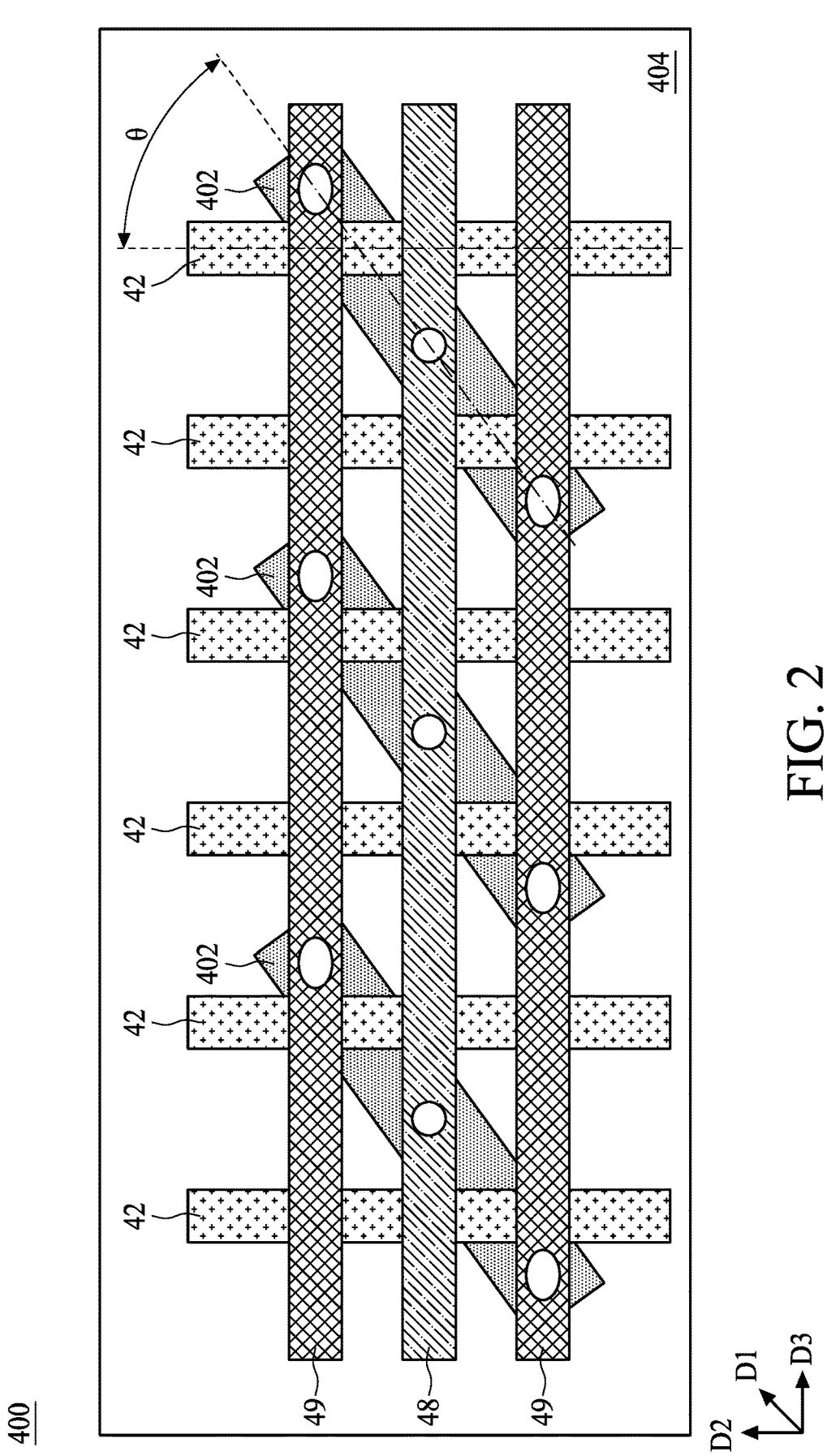
FIG. 2 is a plan view of a one-time-programmable cell in accordance with some embodiments of the present disclosure.

When the OTP device 40 is the anti-fuse device, it includes a plurality of OTP cells 400 (for simplicity, only one OTP cell 400 is shown in FIG. 1). Referring to FIGS. 1 and 2, in some embodiments, the substrate 130 in the second region 120 is formed with a plurality of line-shaped active areas 402 and one or more isolation structures 404 provided between the line-shaped active areas 402 to isolate the line-shaped active areas 402 from one another. In some embodiments, the line-shaped active areas 402 extend along a first direction D1.

In some embodiments, the OTP device 40 further includes a plurality of buried word lines 42 extending along a second direction D2 and intersecting the line-shaped active areas 402 at an angle θ of less than 90 degrees. In some embodiments, the angle θ is preferably in a range between 15 and 60 degrees, but should not be limited thereto. In some embodiments, the buried word line 42 is embedded at a lower portion of a word line trench 420 in the substrate 130. In some embodiments, the buried word line 42 may be composed of a conductor 422, which may include a single layer of metal or multiple layers of conductive materials. In some embodiments, the conductor 422 may be encapsulated by an insulating liner 424 laid on a lower portion 136 of the word line trench 420. In some embodiments, the insulating liners 424 may include oxide or nitride for electrically isolating the buried word lines 42 from the substrate 130.

In some embodiments, the OTP device 40 further includes a first diffusion region 44, coupled to a control bit line 48, and a plurality of second diffusion regions 46 on either side of the buried word lines 42. In some embodiments, the control bit line 48 and a plurality of cell bit lines 49, disposed over the second diffusion regions 46, extend along a third direction D3 substantially perpendicular to the second direction D2. In some embodiments, the first diffusion region 44 is an n+ doped region, and the second diffusion regions 46 are n− doped regions. In some embodiments, the first diffusion region 44 and the second diffusion regions 46 are doped to accommodate programming voltages or currents. In some embodiments, the first diffusion region 44 may be connected to the control bit line 48 through bit line contacts (not shown) for reducing the contact resistance between the first diffusion region 44 and the control bit line 48.

In some embodiments, the OTP device 40 further includes a plurality of cell dielectrics 47 disposed on the second diffusion regions 46 and the substrate 130, and the cell bit lines 49 are disposed on the cell dielectric 47. In some embodiments, a thickness of the cell dielectrics 47 determines a breakdown voltage of the OTP cell 400. In some embodiments, the cell dielectric 47 may be formed of oxide, nitride or oxynitride. In some embodiments, the control bit line 48 and the cell bit lines 49 may be made of polysilicon.

In some embodiments, the semiconductor structure 30 may further include an inter-layer dielectric 52 disposed between the OTP device 40 and the decoupling capacitor array 50 for electrically isolating the OTP device 40 from the decoupling capacitor array 50. In some embodiments, the inter-layer dielectric 52 covers the cell dielectric 47, the control bit line 48 and the cell bit lines 49, and extends into the word line trenches 420. Consequently, the buried word lines 42 are covered by the inter-layer dielectric 52. In some embodiments, the inter-layer dielectric 52 is formed in a manner similar to that of the isolation layer 24. In some embodiments, the inter-layer dielectric 52 and the isolation layer 24 may be formed by the same process.

In some embodiments, the decoupling capacitor array 50 includes a first conductive layer 502 formed over portions of the inter-layer dielectric 52, a second conductive layer 504 over the first conductive layer 502, and an insulating layer 506 disposed between the first conductive layer 502 and the second conductive layer 504. In some embodiments, the first conductive layer 502 includes a plurality of U-shaped structures and may be formed of doped polysilicon or metal such as titanium nitride (TiN or ruthenium (Ru). In some embodiments, the second conductive layer 504 may be formed of low-resistivity material, such as titanium nitride or combinations of titanium nitride, tantalum nitride (TaN), tungsten nitride (WN), ruthenium, iridium (Ir), and platinum (Pt). In some embodiments, the insulating layer 506 may include silicon dioxide, silicon nitride, or high-k materials such as zirconium oxide, hafnium oxide, titanium oxide, and aluminum oxide.

In some embodiments, the semiconductor structure 30 further includes a bottom cell plate 54 between the inter-layer dielectric 52 and the first conductive layer 502 and a top cell plate 56 on the second conductive layer 504. The bottom cell plate 54 is buried in the inter-layer dielectric 52 and physically connected to the first conductive layer 502 for conducting electricity of the first conductive layer 502, and the top cell plate 56 contacts the second conductive layer 504 for conducting electricity thereto.

In some embodiments, a top surface 542 of the bottom cell plate 54 exposed through the first conductive layer 502 is covered by the insulating layer 506. As shown in FIG. 1, the insulating layer 506 is disposed on the bottom cell plate 54 and the first conductive layer 502, the second conductive layer 504 is disposed on the insulating layer 506, and spaces between the top cell plate 56 and the second conductive layer 504 are filled with a conductive filler 508 and an insulating filler 510. In detail, the conductive filler 508 is disposed over the first conductive layer 502, and the insulating filler 510 is disposed at a position where the first conductive layer 502 is not disposed. In some embodiments, the second conductive layer 504 is a conformal layer having a substantially uniform thickness. In some embodiments, the insulating layer 506 is a conformal layer.

Figure 3:
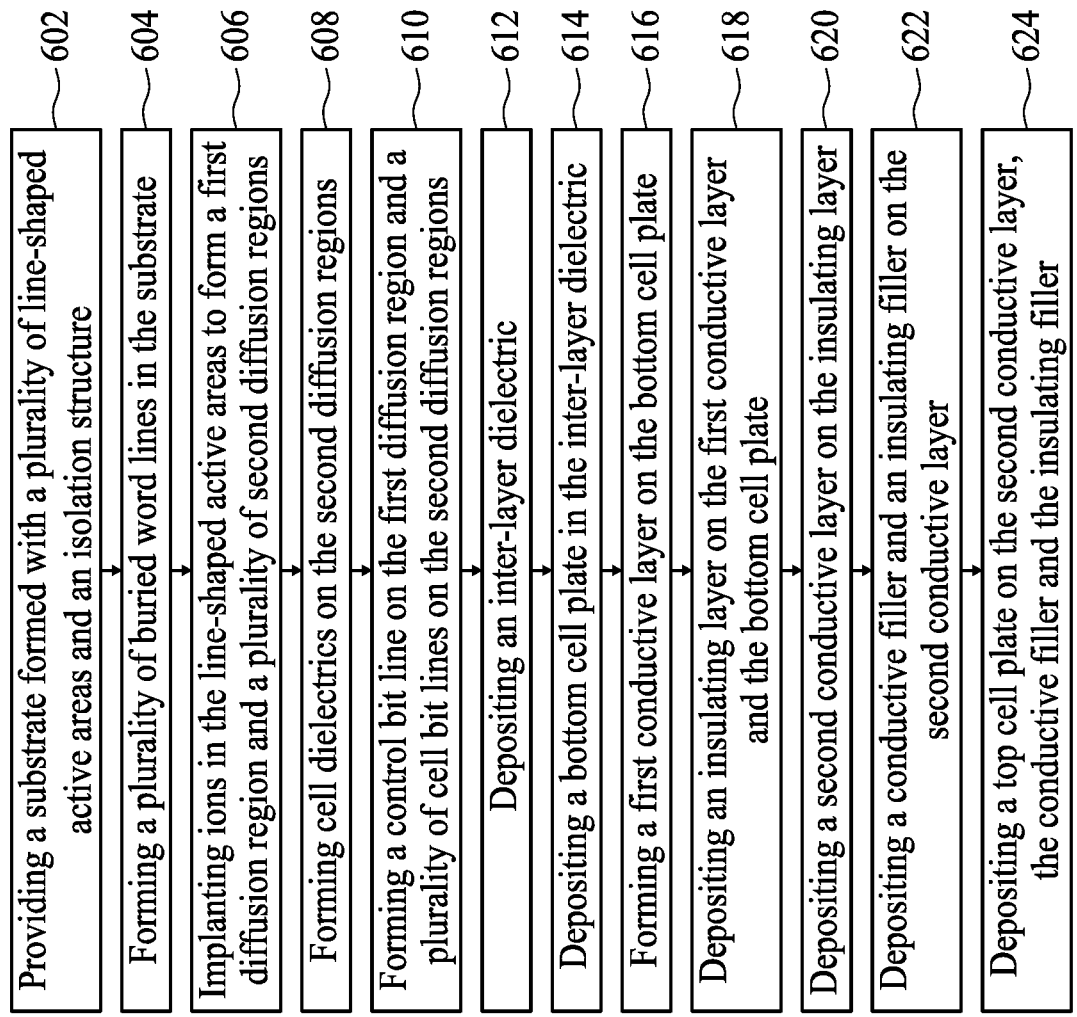
FIG. 3 is a flow diagram illustrating a method of manufacturing a semiconductor structure in accordance with some embodiments of the present disclosure.

FIG. 3 is a flow diagram illustrating a method 60 of manufacturing a semiconductor structure 30 in accordance with some embodiments of the present disclosure. FIGS. 4 to 15 are schematic diagrams illustrating various fabrication stages constructed according to the method 60 for manufacturing the semiconductor structure 30 in accordance with some embodiments of the present disclosure. The stages shown in FIGS. 4 to 15 are also illustrated schematically in the flow diagram in FIG. 3. In the subsequent discussion, the fabrication stages shown in FIGS. 4 to 15 are discussed in reference to the process steps shown in FIG. 3.

Figure 4:
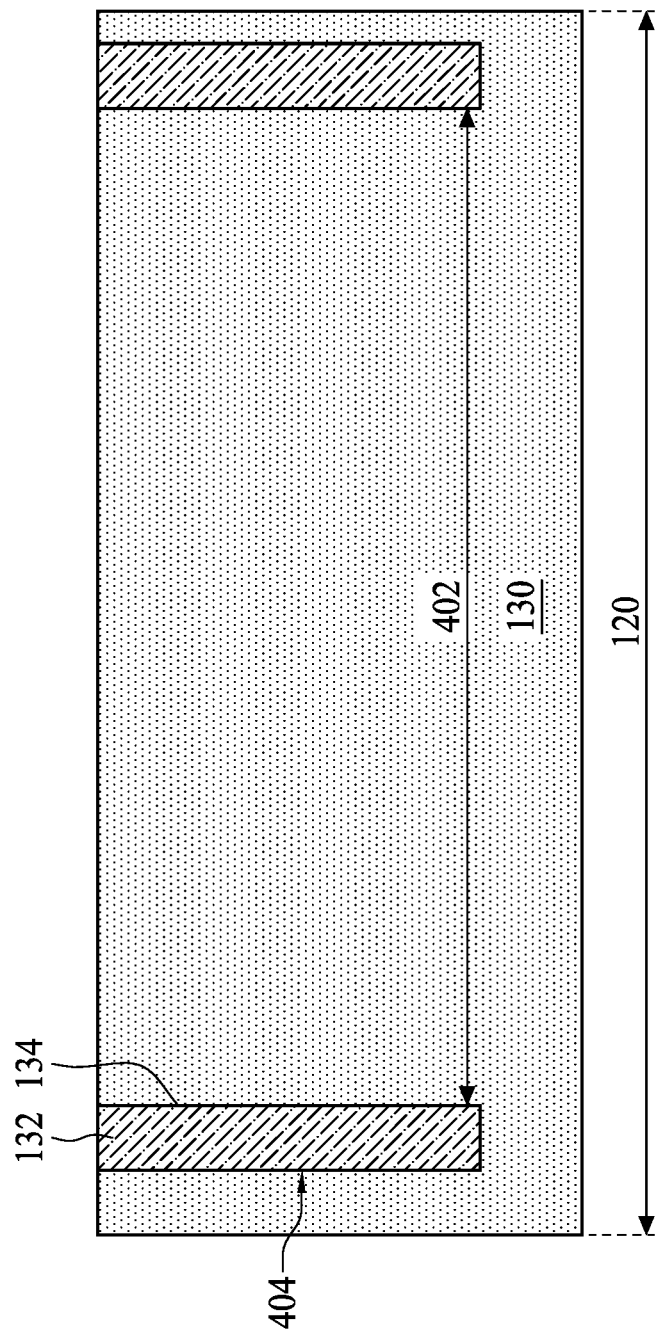
FIGS. 4 through 15 illustrate cross-sectional views of intermediate stages in the formation of a semiconductor structure in accordance with some embodiments of the present disclosure.

Referring to FIG. 4, a substrate 130, including a plurality of line-shaped active areas 402 and one or more isolation structures 404 between the line-shaped active areas 402 to isolate the line-shaped active areas 402, is provided according to a step 602 in FIG. 3. In some embodiments, the substrate 130 may comprise bulk silicon. In some embodiments, the formation of the line-shaped active areas 402 and the isolation structure 404 may include (1) forming a first photoresist pattern (not shown) on the substrate 130, wherein the first photoresist pattern defines a trench pattern to be etched into the substrate 130, (2) performing a first etching process, such as a dry etching process, using the first photoresist pattern as a mask, to etch the substrate 130 and thereby form the line-shaped active areas 402 separated from one another by a trench 134, (3) removing the photoresist pattern, and (4) depositing insulating materials 132 such as silicon oxide in the trench 134.

Figure 5:
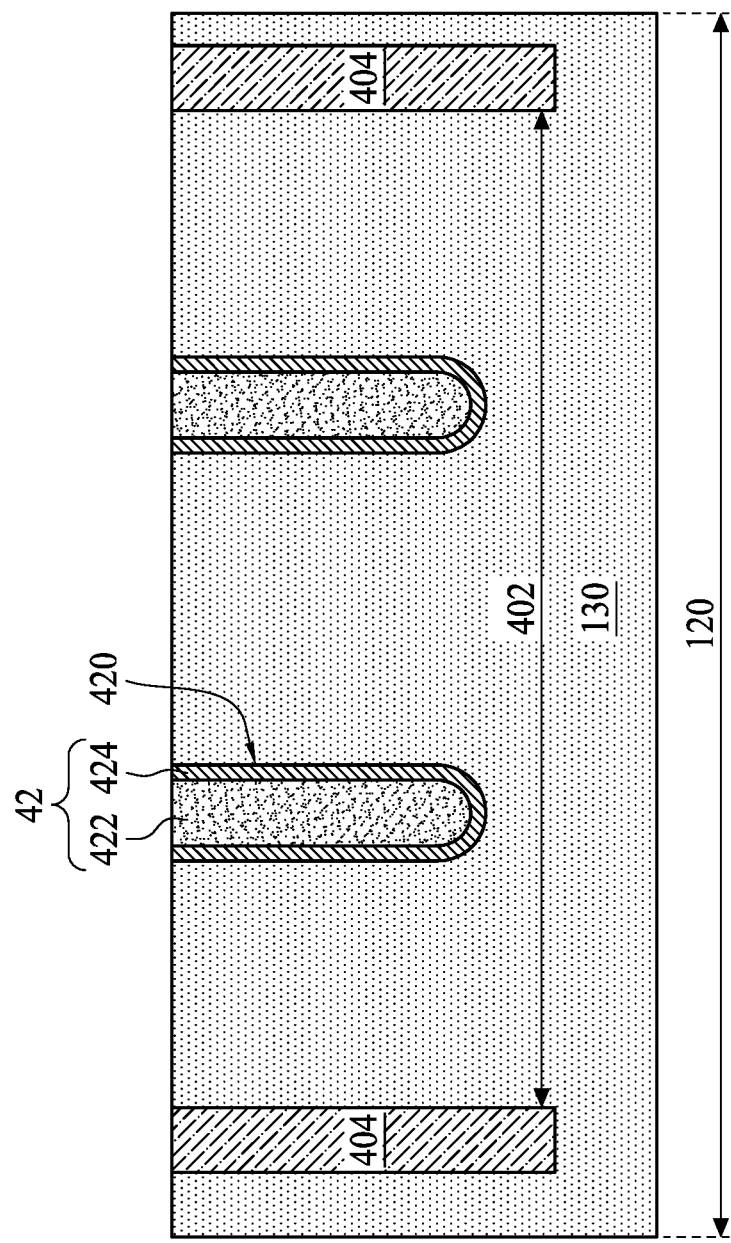

Referring to FIG. 5, in some embodiments, a plurality of buried word lines 42 are fabricated in the substrate 130 according to a step 604 in FIG. 3. In some embodiments, the buried word lines 42 parallel to each other are formed in one of the line-shaped active areas 402. In some embodiments, the formation of the buried word lines 42 may include (1) forming a second photoresist pattern (not shown) on the substrate 130, wherein the second photoresist pattern defines a plurality of word line trench patterns to be etched into the substrate 130 in the line-shaped active areas 402, (2) performing a second etching process, such as a dry etching process, using the second photoresist pattern as a mask, to etch the substrate 130 and thereby form a plurality of word line trenches 420, (3) forming an insulating liner 424 using a deposition process or a thermal process in the word line trenches 420, and (4) depositing a conductor 422 in the word line trenches 420 such that the conductor 422 is surrounded by the insulating liner 424. In some embodiments, the insulating liner 424, including oxide-containing material, is a conformal layer.

Figure 6:
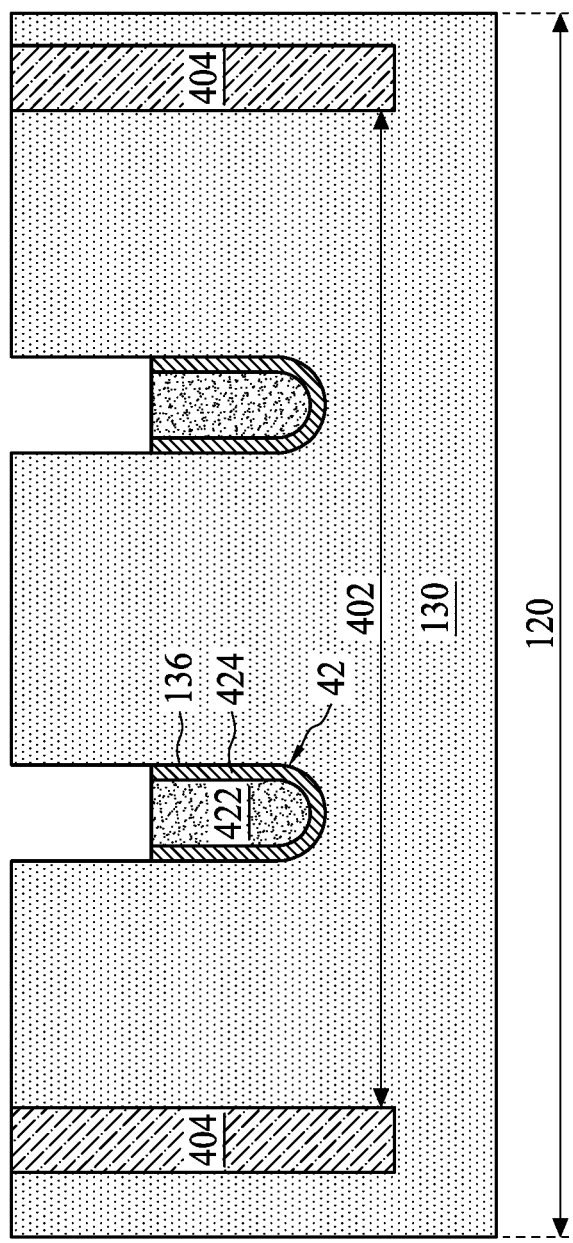

Referring to FIG. 6, in some embodiments, after the deposition of the conductor 422, an etching process may be performed to recess the buried word lines 42 (and the insulating liner 424) into the substrate 130. In some embodiments, the buried word lines 42 are disposed at a lower portion 136 of the word line trenches 420. In some embodiments, the conductor 422 may include titanium nitride (TiN), tungsten nitride (WN), tungsten/tungsten nitride (W/WN), tantalum nitride (TaN), titanium silicon nitride (TiSiN), tantalum silicon nitride (TaSiN), tungsten silicon nitride (WSiN), or a combination thereof. In some embodiments, the conductor 422 may be formed using a CVD process or an atomic layer deposition (ALD) process.

Figure 7:
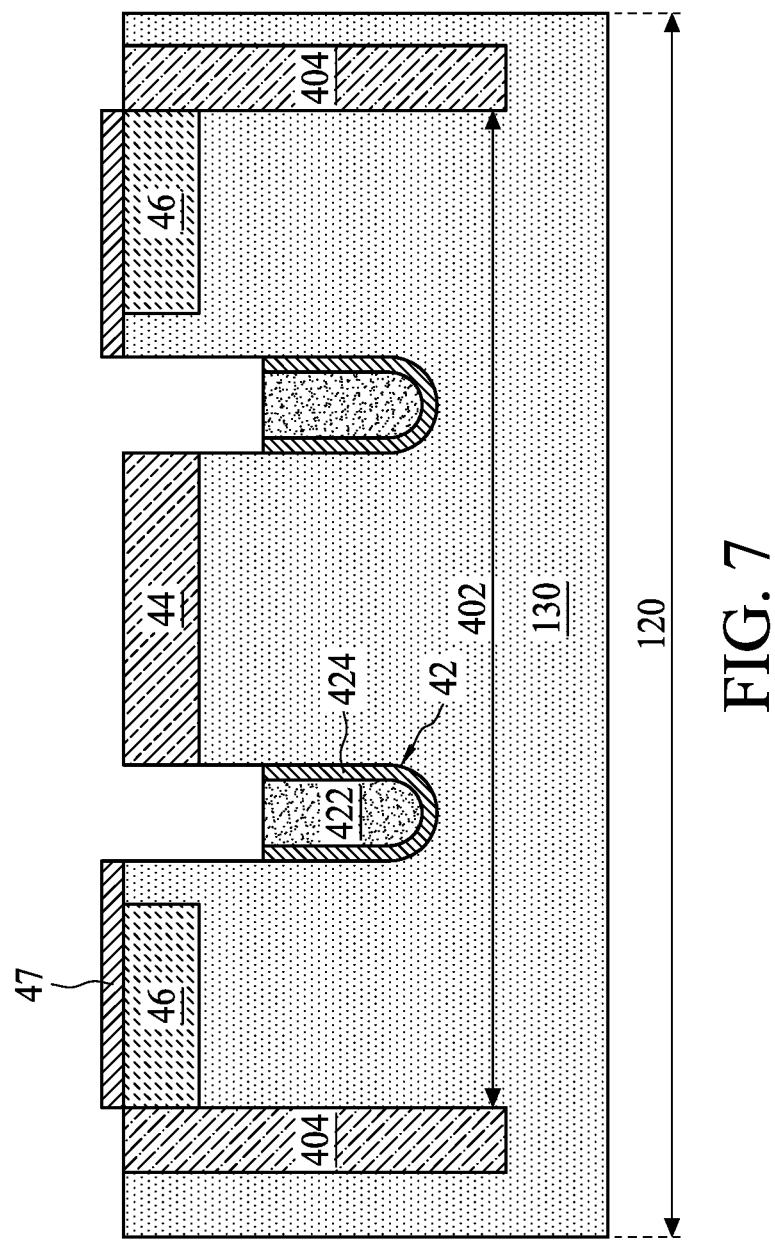

Referring to FIG. 7, in some embodiments, the line-shaped active areas 402 are implanted with ions to form a first diffusion region 44 and a plurality of second diffusion regions 46 according to a step 606 in FIG. 3. In some embodiments, the first diffusion region 44 is an n+ region, and the second diffusion regions 46 are n− regions. In some embodiments, arsenic (As) or phosphorus (P) can be used in the ion implantation process to form the first diffusion region 44 and the second diffusion regions 46. In some embodiments, the first diffusion region 44 and the second diffusion regions 46 may be formed in the substrate 130 using a chemical diffusion process or an ion implantation process to dope the substrate 130.

Next, thin cell dielectrics 47 are formed on the second diffusion regions 46 according to a step 608 in FIG. 3. In some embodiments, the cell dielectrics 47 include oxide-containing material. Specifically, the cell dielectric layer 47 is made of metal oxide, such as titanium dioxide ($TiO_2$) or oxide-containing chalcogenide materials. In some embodiments, the cell dielectrics 47 may be formed by a CVD process, a thermal oxidation process, a rapid thermal process (RTP) or an atomic layer deposition (ALD) process.

Figure 8:
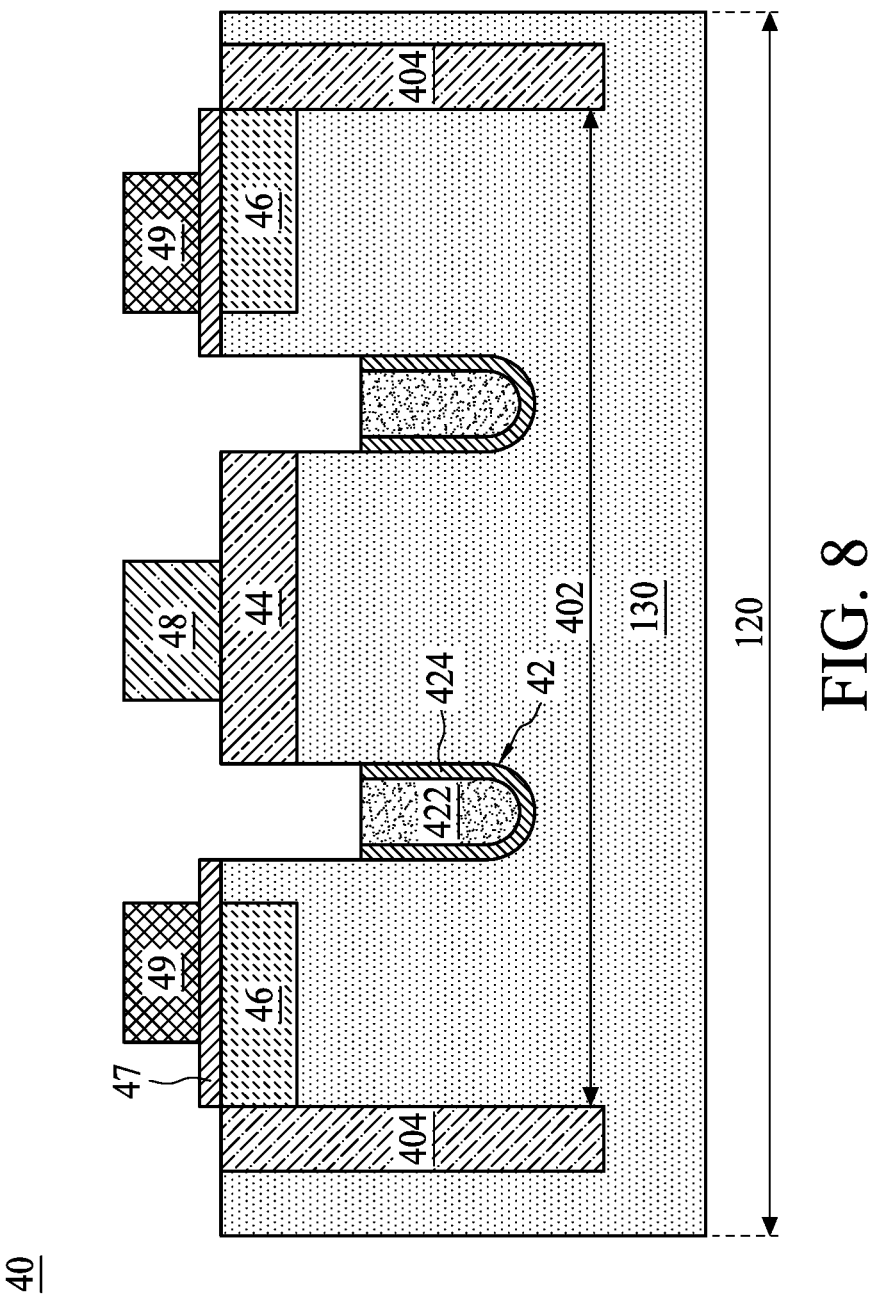

Referring to FIG. 8, in some embodiments, a control bit line 48 is formed on the first diffusion region 44 and a plurality of cell bit lines 49 are formed over the second diffusion regions 46 according to a step 610 in FIG. 3. Accordingly, the OTP device 40 is completely formed. In some embodiments, the control bit line 48 and the cell bit lines 49 containing conductive materials may be formed by CVD processes.

Figure 9:
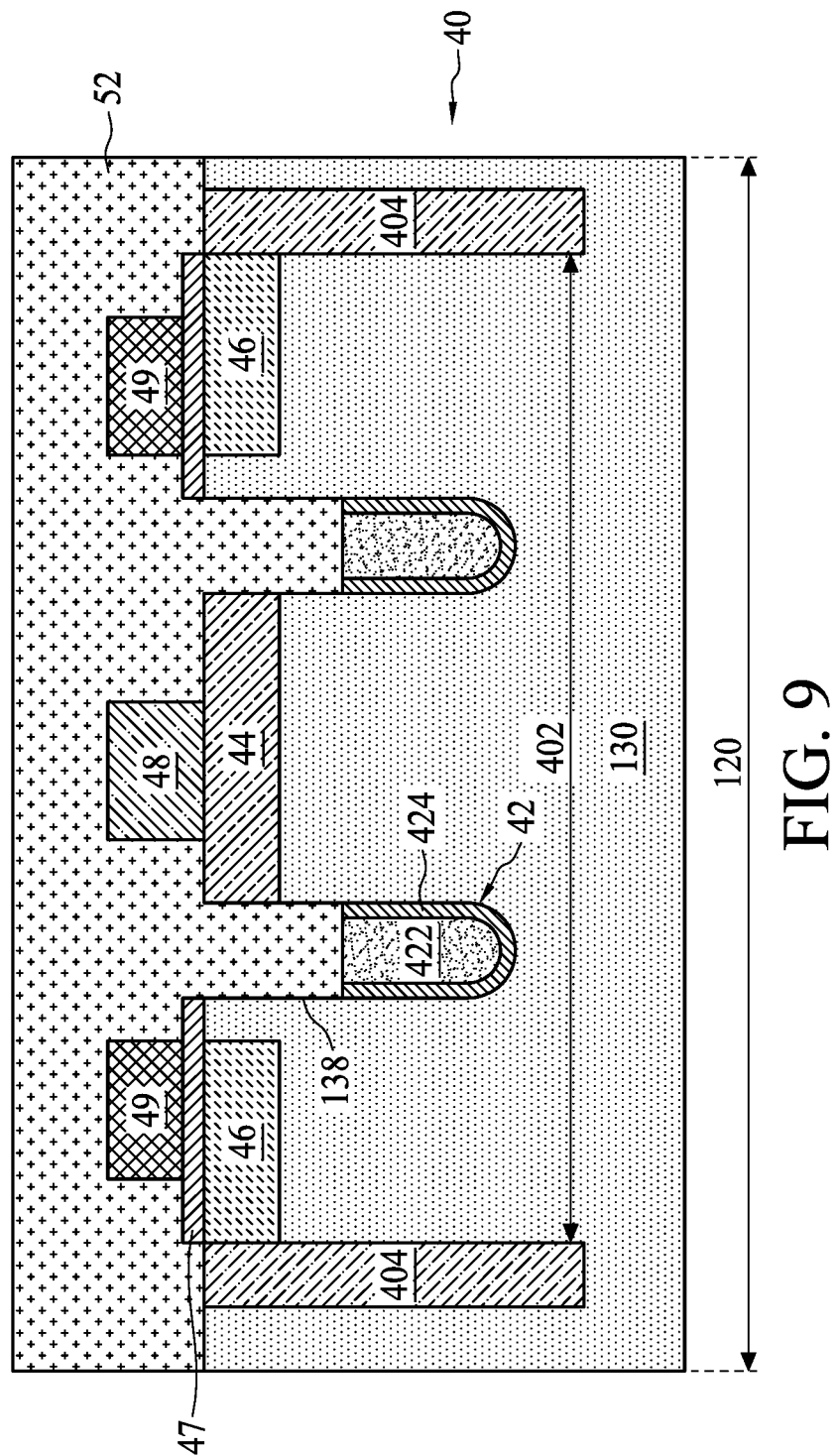

Referring to FIG. 9, in some embodiments, an inter-layer dielectric 52 is deposited to cover the buried word lines 42, the control bit line 48, the cell bit lines 49 and portions of the substrate 130 according to a step 612 in FIG. 3. In some embodiments, the inter-layer dielectric 52 covers sidewalls 138 of the substrate 130 that are exposed through the buried word lines 42. In some embodiments, the inter-layer dielectric 52 is typically deposited with a low-pressure CVD process or a plasma-enhanced CVD process. In some embodiments, after the inter-layer dielectric 52 is deposited, a planarization process using any suitable method, such as a chemical CMP process, is optionally performed on the inter-layer dielectric 52 for providing better topography.

Figure 10:
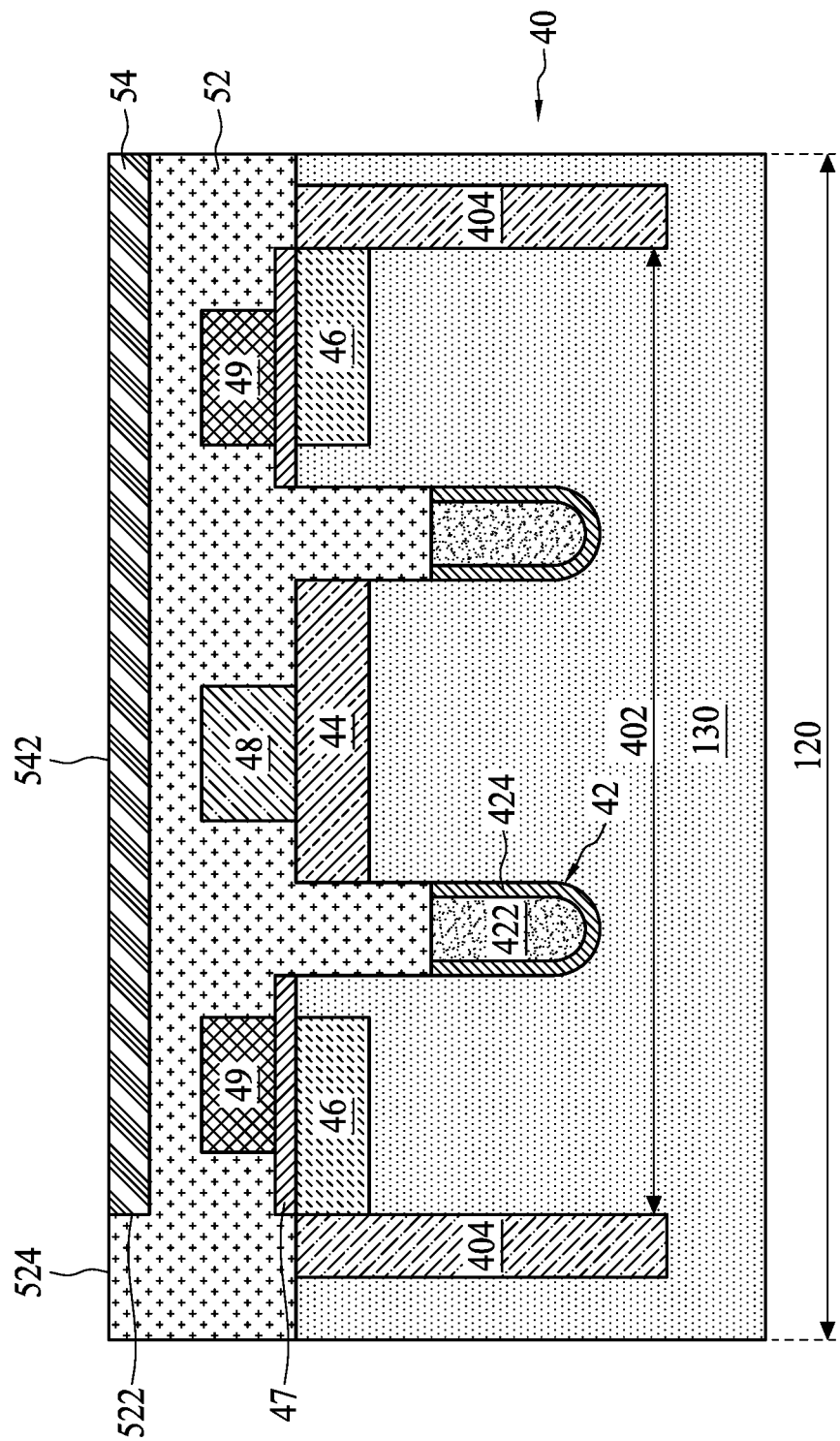

Referring to FIG. 10, in some embodiments, a bottom cell plate 54 is deposited in the inter-layer dielectric 52 according to a step 614 in FIG. 3. In some embodiments, the formation of the bottom cell plate 54 includes (1) forming a third photoresist pattern (not shown) on the inter-layer dielectric 52, wherein the third photoresist pattern defines a trench pattern to be etched into the inter-layer dielectric 52, (2) performing a third etching process, using the third photoresist pattern as a mask, to etch the inter-layer dielectric 52 and thereby form an opening 522 in the inter-layer dielectric 52, (3) removing the photoresist pattern, (4) depositing a first metallic material in the opening 522, wherein, in some embodiments, the first metallic material may be deposited in the opening 522 by a CVD process, and (5) optionally performing a CMP process or an etching process to remove the first metallic material on the inter-layer dielectric 52, such that a top surface 542 of the bottom cell plate 54 is coplanar with a top surface 524 of the inter-layer dielectric 52. In alternative embodiments, the top cell plate 54 may be formed on the inter-layer dielectric 52 by depositing the first metallic material on the inter-layer dielectric 52 and performing a CMP process to provide the bottom cell plate 54 with a substantially planar top surface 542. Therefore, the top surface 524 and 542 are in the different horizontal levels.

Figure 11:
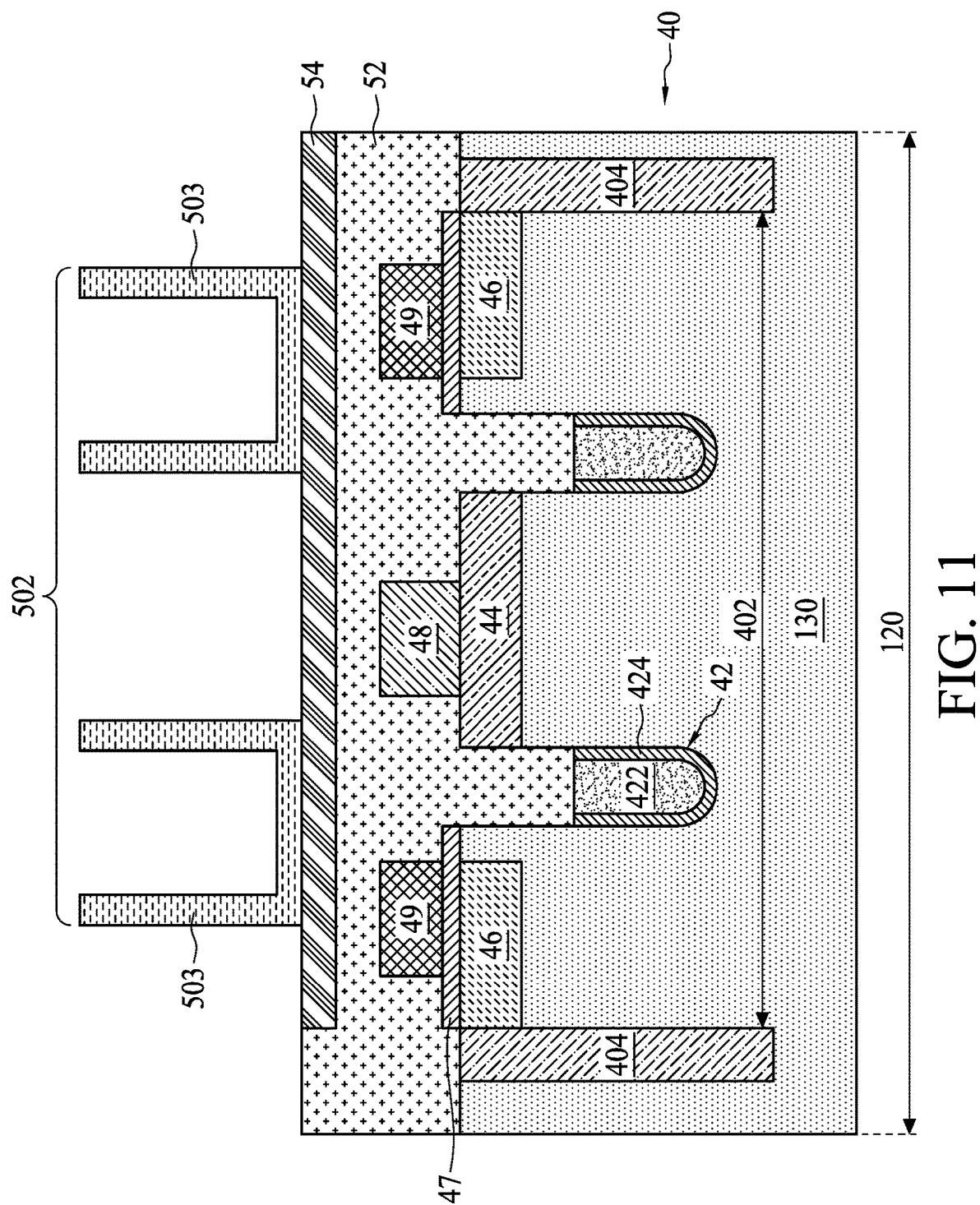

Referring to FIG. 11, in some embodiments, a first conductive layer 502 is formed on the bottom cell plate 54 according to a step 616 in FIG. 3. In some embodiments, the fabrication of the first conductive layer 502 involves sequentially depositing a blanket first conductive material on the bottom cell plate 54 (and the inter-layer dielectric 52), and patterning the first conductive material using lithography and etching processes to form a plurality of U-shaped structures 503.

Figure 12:
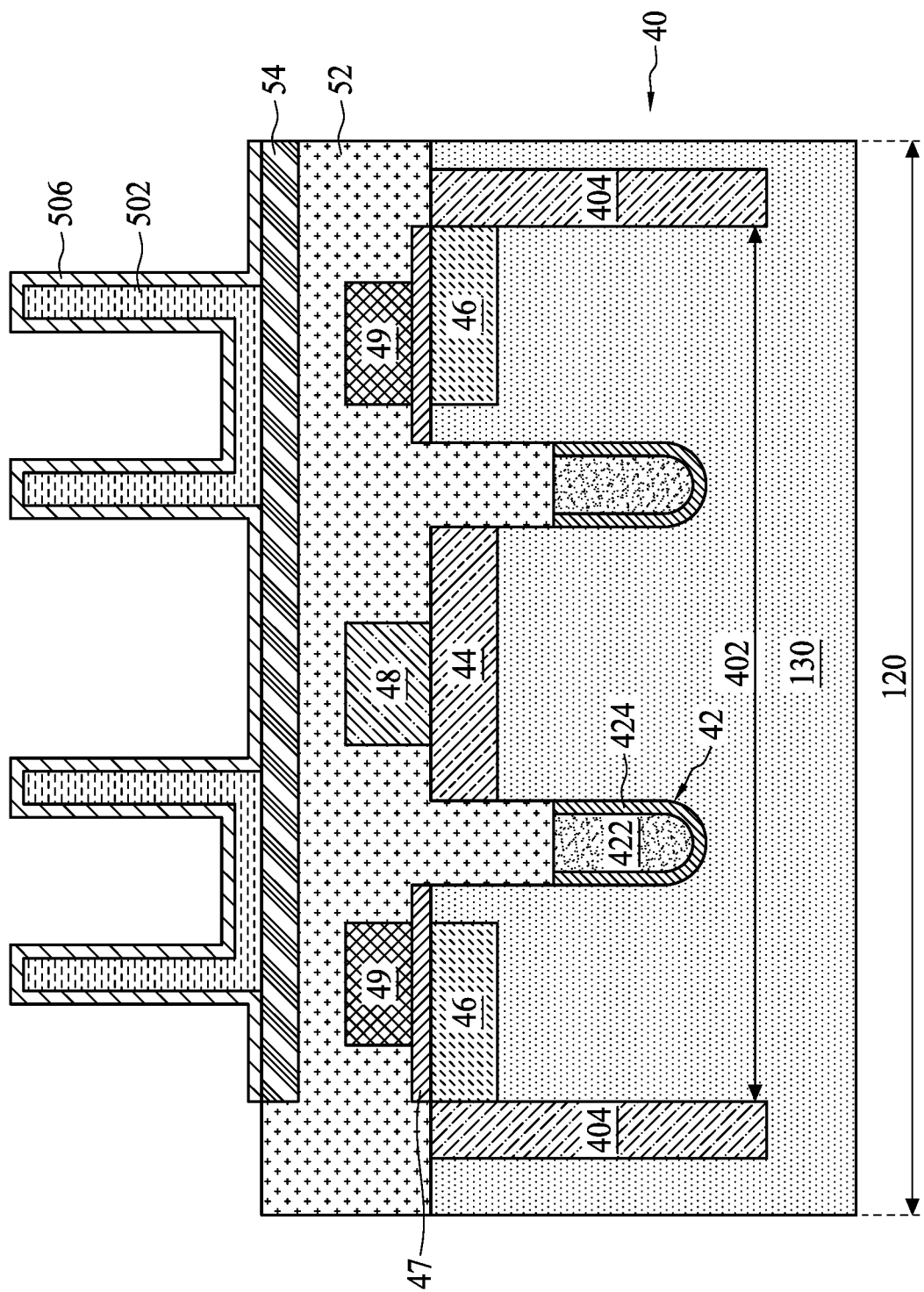

Referring to FIG. 12, in some embodiments, an insulating layer 506 is at least deposited on the first conductive layer 502 according to a step 618 in FIG. 3. In some embodiments, the insulating layer 506 covers the bottom cell plate 54 and the first conductive layer 502. In some embodiments, the insulating layer 506 may be a conformal layer and formed by a CVD process.

Figure 13:
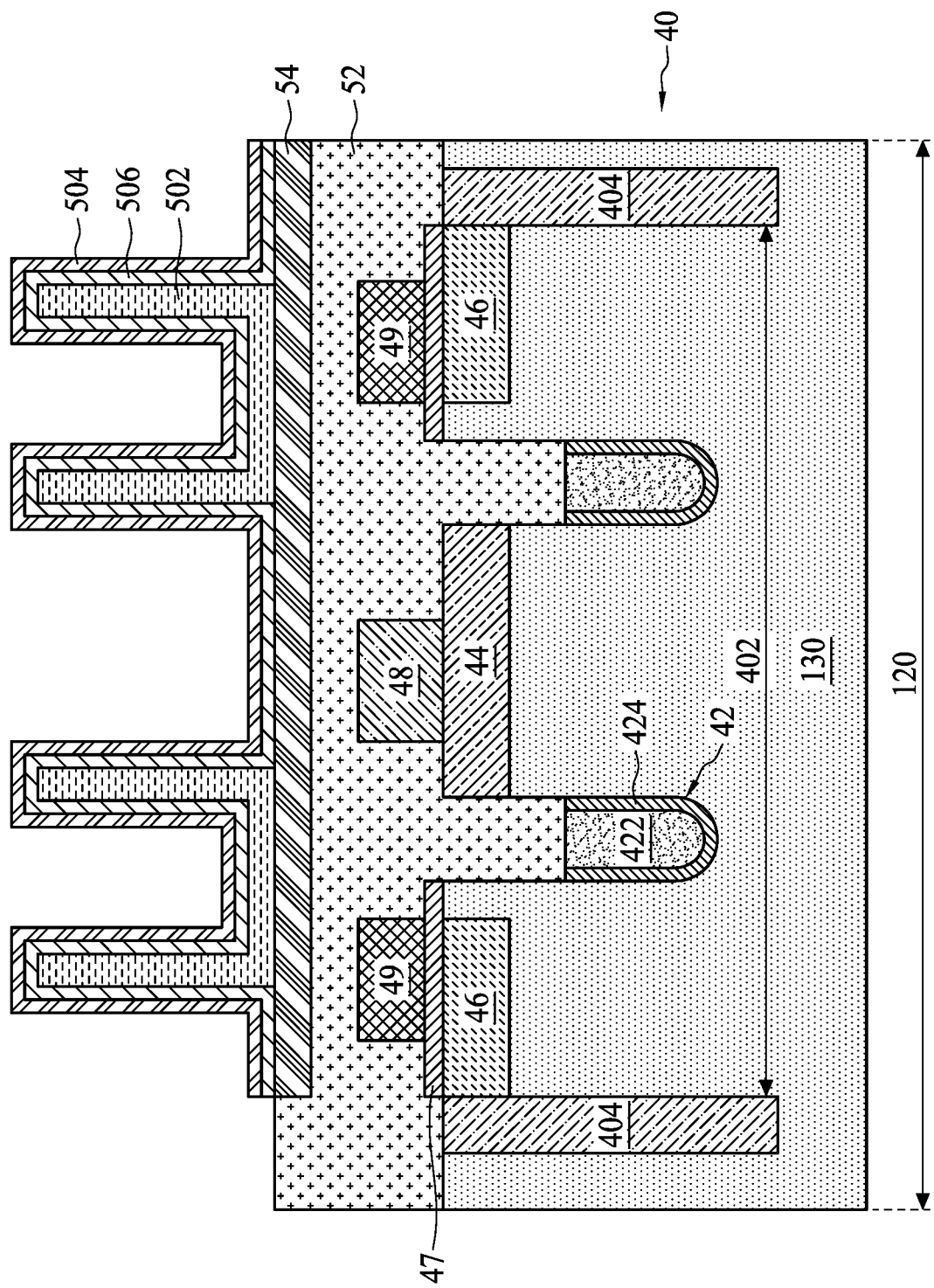

Referring to FIG. 13, in some embodiments, a second conductive layer 504 is deposited on the insulating layer 506 according to a step 620 in FIG. 3. In some embodiments, the second conductive layer 504 may be a substantially conformal layer and formed by a CVD process.

Figure 14:
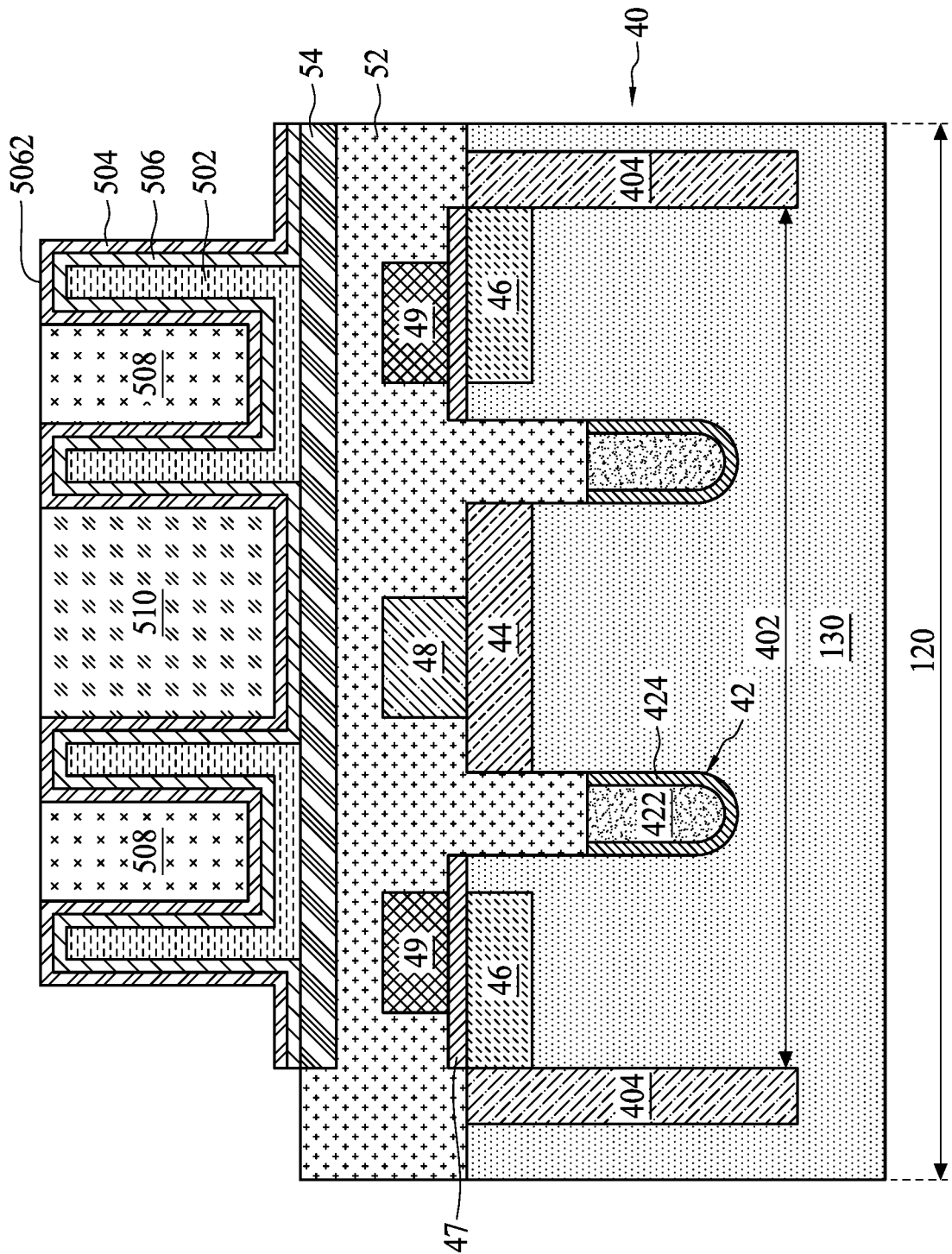

Referring to FIG. 14, in some embodiments, a conductive filler 508 and an insulating filler 510 are deposited on portions of the second conductive layer 504 according to a step 622 in FIG. 3. In some embodiments, the conductive filler 508 is formed by depositing at least one conductive material after the deposition of the second conductive layer 504 but prior to the deposition of the insulating filler 510. Specifically, the fabrication of the conductive filler 508 involves sequentially depositing the conductive material on the second conductive layer 504, and patterning the conductive material using lithography and etching processes to remove portions of the conductive material not above the first conductive layer 502 and remove portions of the conductive material over a topmost surface 5062 of the second conductive layer 504 to form the conductive filler 508. After the forming of the conductive filler 508, an insulation material is deposited on the conductive filler 508 and the second conductive layer 504 exposed through the conductive filler 508, and a planarization process, such as a CMP process, is then performed to remove the insulation material above the topmost surface 5062 of the second conductive layer 504. In alternative embodiments, the insulating filler 510 may be formed by depositing at least one insulation material after the deposition of the second conductive layer 504 but prior to the forming of the conductive filler 508.

Figure 15:
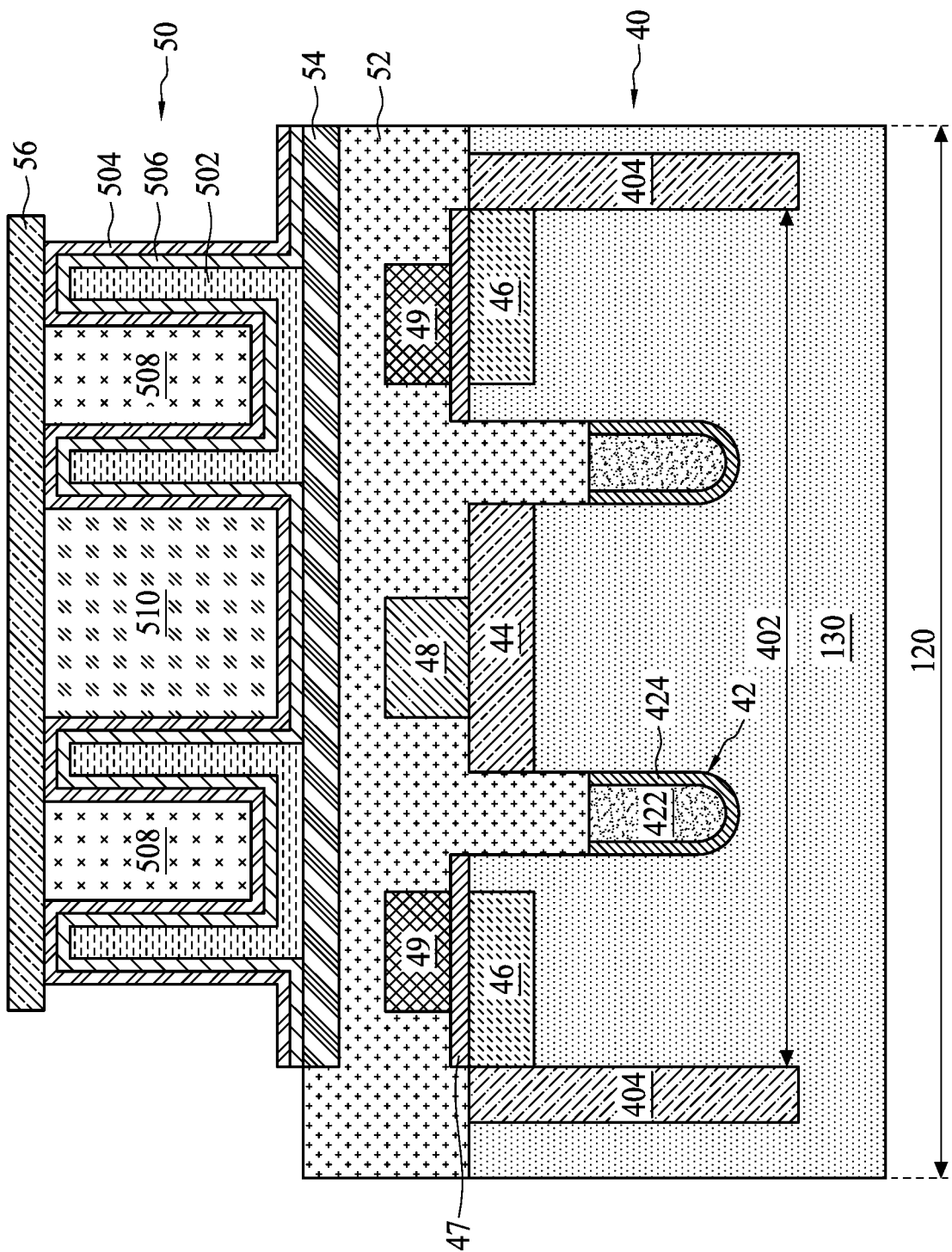

Referring to FIG. 15, in some embodiments, a top cell plate 56 is formed on the second conductive layer 504, the conductive filler 508 and the insulating filler 510 according to a step 624 in FIG. 3. Accordingly, the semiconductor structure 30 is completely formed. The fabrication of the top cell plate 56 involves sequentially depositing a second metallic material to cover the second conductive layer 504, the conductive filler 508 and the insulating filler 510, and patterning the second metallic material using lithography and etching processes to leave a portion of the second metallic material parallel to the bottom cell plate 54.

One aspect of the present disclosure provides a semiconductor structure. The semiconductor structure includes a substrate, a plurality of one-time-programmable (OTP) cells, a bottom cell plate, a top cell plate and a decoupling capacitor array. The substrate includes a plurality of active areas and at least one isolation structure provided between the active areas to isolate the active areas from one another. The plurality of one-time-programmable (OTP) cells are disposed in the active areas, the bottom cell plate is disposed on the OTP cells, and the top cell plate is disposed over the bottom cell plate. The decoupling capacitor array is disposed between the bottom cell plate and the top cell plate.

One aspect of the present disclosure provides a semiconductor chip. The semiconductor chip includes a first region including a main device and a second region including a one-time-programmable (OTP) device, a bottom cell plate over the OTP device, a top cell plate over the bottom cell plate, and a decoupling capacitor array between the bottom cell plate and the top cell plate.

One aspect of the present disclosure provides a method of manufacturing a semiconductor structure. The method includes steps of providing a substrate formed with a plurality of line-shaped active areas and an isolation structure between the line-shaped active areas to isolate the line-shaped active areas; forming a plurality of buried word lines in the line-shaped active areas; implanting ions in the line-shaped active areas to form a first diffusion region and a plurality of second diffusion regions on either side of the buried word lines; depositing cell dielectrics on the second diffusion regions; depositing a control bit line on the first diffusion region; depositing a plurality of cell bit lines on the cell dielectric; depositing an inter-layer dielectric on the buried word lines, the control bit line and the cell bit lines; forming a bottom cell plate on the inter-layer dielectric; depositing a first conductive layer on portions of the bottom cell plate; depositing an insulating layer on the first conductive layer; depositing a second conductive layer on the insulating layer; and depositing a top cell plate on the second conductive layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor structure, comprising:
a substrate comprising a plurality of active areas and at least one isolation structure provided between the plurality of active areas to isolate the plurality of active areas from one another;
a plurality of one-time-programmable (OTP) cells disposed in the plurality of active areas;
a bottom cell plate disposed on the plurality of OTP cells;
a top cell plate disposed over the bottom cell plate; and
a decoupling capacitor array between the bottom cell plate and the top cell plate.

2. The semiconductor structure of claim 1, wherein the decoupling capacitor array comprises:
a first conductive layer disposed on portions of the bottom cell plate;
an insulating layer disposed on the first conductive layer; and
a second conductive layer disposed on the insulating layer.

3. The semiconductor structure of claim 2, wherein the first conductive layer comprises a plurality of U-shaped structures.

4. The semiconductor structure of claim 3, further comprising a conductive filler and an insulating filler disposed between the second conductive layer and the top cell plate, wherein the conductive filler is surrounded by the plurality of U-shaped structures, and the insulating filler is disposed between the plurality of U-shaped structures.

5. The semiconductor structure of claim 2, wherein the insulating layer further covers the bottom cell plate exposed through the first conductive layer.

6. The semiconductor structure of claim 1, wherein each of the plurality of OTP cells comprises an antifuse-based device that changes state from non-conducting to conducting in order to represent binary states.

7. The semiconductor structure of claim 1, further comprising an inter-layer dielectric sandwiched between the plurality of OTP cells and the decoupling capacitor array, wherein the bottom cell plate is disposed in the inter-layer dielectric.

8. The semiconductor structure of claim 1, wherein at least one of the plurality of OTP cells comprises:
a first diffusion region in the substrate;
a control bit line disposed on the first diffusion region;
a plurality of second diffusion regions in the substrate and at opposite sides of the first diffusion region;
a plurality of buried word lines in the substrate and between the first diffusion region and the plurality of second diffusion regions;
a plurality of cell dielectrics disposed on the plurality of second diffusion regions; and
a plurality of cell bit lines disposed on the plurality of cell dielectrics.

9. The semiconductor structure of claim 8, wherein at least one of the plurality of buried word lines comprises:
a conductor disposed in the substrate; and
an insulating liner disposed between the substrate and the conductor.

10. The semiconductor structure of claim 8, wherein the plurality of active areas extend along a first direction, the plurality of buried word lines extend along a second direction and intersect with the plurality of active areas at an angle of less than 90 degrees, and the control bit line and the plurality of cell bit lines extend along a third direction substantially perpendicular to the second direction.

11. The semiconductor structure of claim 10, wherein the angle is in a range between 15 and 60 degrees.

12. A semiconductor chip, comprising:
a first region including a main device;
a second region including a one-time-programmable (OTP) device, a bottom cell plate over the OTP device, a top cell plate over the bottom cell plate, and a decoupling capacitor array sandwiched between the bottom cell plate and the top cell plate.

13. The semiconductor chip of claim 12, further comprising a substrate extending to comprise a portion of the main device and a portion of the OTP device.

14. The semiconductor chip of claim 13, wherein the OTP device comprises a plurality of OTP cells disposed in active areas of the substrate and comprises:
a first diffusion region in the substrate;
a control bit line disposed on the first diffusion region;
a plurality of second diffusion regions in the substrate and at opposite sides of the first diffusion region;

a plurality of buried word lines in the substrate and between the first diffusion region and the plurality of second diffusion regions;
a plurality of cell dielectrics disposed on the plurality of second diffusion regions; and
a plurality of cell bit lines disposed on the plurality of cell dielectrics.

15. The semiconductor chip of claim 12, wherein the decoupling capacitor array comprises:
a first conductive layer on the bottom cell plate, wherein the first conductive layer comprises a plurality of U-shaped structures;
a second conductive layer disposed over the first conductive layer; and
an insulating layer between the first conductive layer and the second conductive layer.

16. The semiconductor chip of claim 12, wherein the main device comprises a plurality of access transistors and a plurality of storage capacitors disposed over the plurality of access transistors and electrically coupled to the plurality of access transistors.

17. The semiconductor chip of claim 16, wherein the main device further comprises an isolation layer disposed between each of the plurality of access transistors and each of the plurality of storage capacitors, and the main device still further comprises a plug disposed in the isolation layer and connecting each of the plurality of access transistors to each of the plurality of storage capacitors; and the decoupling capacitor array is electrically isolated from the OTP device.

* * * * *